(12) United States Patent
Xu et al.

(10) Patent No.: US 10,123,428 B2
(45) Date of Patent: Nov. 6, 2018

(54) PACKAGE MODULE

(71) Applicant: Delta Electronics (Shanghai) Co., Ltd., Shanghai (CN)

(72) Inventors: Hai-Bin Xu, Shanghai (CN); Tao Wang, Shanghai (CN); Shou-Yu Hong, Shanghai (CN); Zhen-Qing Zhao, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 15/067,146

(22) Filed: Mar. 10, 2016

(65) Prior Publication Data

US 2016/0374223 A1   Dec. 22, 2016

(30) Foreign Application Priority Data

Jun. 16, 2015 (CN) .......................... 2015 1 0333366

(51) Int. Cl.
| | |
|---|---|
| *H05K 7/14* | (2006.01) |
| *H05K 3/30* | (2006.01) |
| *H05K 5/06* | (2006.01) |
| *H05K 3/28* | (2006.01) |

(52) U.S. Cl.
CPC .............. *H05K 3/30* (2013.01); *H05K 3/284* (2013.01); *H05K 5/064* (2013.01); *H05K 7/1432* (2013.01); *H05K 2201/1003* (2013.01); *H05K 2201/10015* (2013.01); *H05K 2201/10022* (2013.01); *H05K 2201/10053* (2013.01); *H05K 2201/10636* (2013.01); *H05K 2201/2018* (2013.01); *H05K 2203/1316* (2013.01); *Y02P 70/611* (2015.11)

(58) Field of Classification Search
CPC ........ H05K 3/30; H05K 7/1432; H05K 5/064; H05K 1/18; H05K 2201/10015; H05K 2201/10022; H05K 2201/10053; H05K 2203/1305; H05K 2201/1003
USPC ................................ 361/752, 782, 728, 748
See application file for complete search history.

(56) References Cited

U.S. PATENT DOCUMENTS

| | | | | |
|---|---|---|---|---|
| 6,246,115 B1* | 6/2001 | Tang | ...................... | H01L 21/565 257/675 |
| 6,294,408 B1* | 9/2001 | Edwards | ................. | H01L 23/10 257/E23.087 |

(Continued)

FOREIGN PATENT DOCUMENTS

| | | |
|---|---|---|
| CN | 101261970 A | 9/2008 |
| JP | S55-14785 U | 1/1980 |

(Continued)

*Primary Examiner* — Tuan T Dinh
*Assistant Examiner* — Rockshana D Chowdhury
(74) *Attorney, Agent, or Firm* — CKC & Partners Co., Ltd.

(57) ABSTRACT

A package module includes a circuit board, an electronic component disposed on the circuit board, a frame disposed next to at least one side of the electronic component, and an encapsulant. A gap is formed between the frame and the electronic component. The encapsulant includes a first portion covering at least a part of the circuit board, and a second portion filling into at least a part of the gap. The first portion has a first height relative to the circuit board, and the second portion has a second height relative to the circuit board, in which the second height is greater than the first height.

16 Claims, 8 Drawing Sheets

(56) References Cited

U.S. PATENT DOCUMENTS

| | | | | |
|---|---|---|---|---|
| 6,433,420 | B1 * | 8/2002 | Yang | H01L 21/565 257/667 |
| 6,770,961 | B2 * | 8/2004 | Lee | H01L 21/565 257/687 |
| 6,777,819 | B2 * | 8/2004 | Huang | H01L 21/565 257/704 |
| 7,057,277 | B2 * | 6/2006 | Chen | H01L 21/561 257/706 |
| 7,989,947 | B2 * | 8/2011 | Otani | H01L 21/565 257/706 |
| 8,008,753 | B1 * | 8/2011 | Bolognia | H01L 23/552 257/659 |
| 8,319,108 | B2 * | 11/2012 | Yamaguchi | H01L 21/563 174/250 |
| 2002/0020910 | A1 | 2/2002 | Kinouchi et al. | |
| 2011/0229708 | A1 * | 9/2011 | Asami | H01L 23/295 428/316.6 |
| 2013/0176689 | A1 * | 7/2013 | Nishimura | H05K 3/284 361/739 |
| 2013/0183779 | A1 | 7/2013 | Pachler et al. | |
| 2013/0301221 | A1 * | 11/2013 | Wu | H01L 23/38 361/707 |
| 2014/0160710 | A1 * | 6/2014 | Yan | H01L 51/5246 361/784 |
| 2015/0016073 | A1 * | 1/2015 | Poprawa | H05K 1/185 361/748 |
| 2015/0116946 | A1 * | 4/2015 | Katase | H05K 7/2039 361/713 |

FOREIGN PATENT DOCUMENTS

| | | |
|---|---|---|
| JP | S61-188361 U | 11/1986 |
| JP | H5-48352 U | 6/1993 |
| JP | H08115993 A | 5/1996 |
| JP | 2010263108 A | 11/2010 |
| TW | 201409626 A | 3/2014 |
| WO | 2008075401 A1 | 6/2008 |

* cited by examiner

PACKAGE MODULE

RELATED APPLICATIONS

This application claims priority to China Application Serial Number 201510333366.5, filed Jun. 16, 2015, which is herein incorporated by reference.

BACKGROUND

Field of Invention

The present disclosure is related to a package module, and more particularly, to a package module in which the amount of encapsulant can be saved.

Description of Related Art

High efficiency, high density, and high reliability have been the tendencies toward which the power electronic devices are developed, in order to achieve the objects of energy-saving, cost reduction, and a good lifetime. For example, the integrated power module (IPM), in which multiple semiconductor devices are integrated into a device package, provides the possibility of further improving the space utilization in a package.

In a packaging process, it is often necessary to fill protective encapsulant into the housing to electrically isolate inner electronic components and to protect wires or terminals on the electronic components. Because height differences often exist among the electronic components, the protective encapsulant on electronic components with a low height may have an excess thickness, which corresponds to an unnecessary cost.

SUMMARY

The present disclosure provides a package module, in which a frame is disposed next to at least one side of an electronic component to locally heighten an encapsulant.

One embodiment of the present disclosure provides a package module including a circuit board, an electronic component disposed on the circuit board, a frame disposed next to at least one side of the electronic component, and an encapsulant. A gap is formed between the frame and the electronic component, wherein the encapsulant includes a first portion covering at least a part of the circuit board and a second portion filling into at least a part of the gap. The first portion is connected to the second portion. The first portion has a first height relative to the circuit board, and the second portion has a second height relative to the circuit board, wherein the second height is greater than the first height.

Another embodiment of the present disclosure is a packaging method for the above-mentioned package module, including disposing the electronic component on the circuit board; disposing the frame next to the at least one side of the electronic component so as to form the gap between the frame and the electronic component; and filling the encapsulant, wherein a portion of the encapsulant covers on at least a part of the circuit board so as to be the first portion, and another portion of the encapsulant fills into at least a part of the gap so as to be the second portion.

In this package module which is packaged in a housing, the frame is disposed next to the at least one side of the electronic component, and the encapsulant is filled into the gap between the frame and the electronic component. As a result, the height of the encapsulant covering the electronic component may be higher than that of other portion of the encapsulant (e.g. the encapsulant covering the circuit board), and therefore the amount of the encapsulant is reduced.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

In the following, the spirit of the present disclosure will be described in detail via the illustration of the figures and the detailed description. Persons having ordinary skills in the art after understanding the preferred embodiments of the present disclosure would be able to modify and change the teaching of the present disclosure, and these modifications and changes do not depart from the spirit and scope of the present disclosure.

Figure 1:
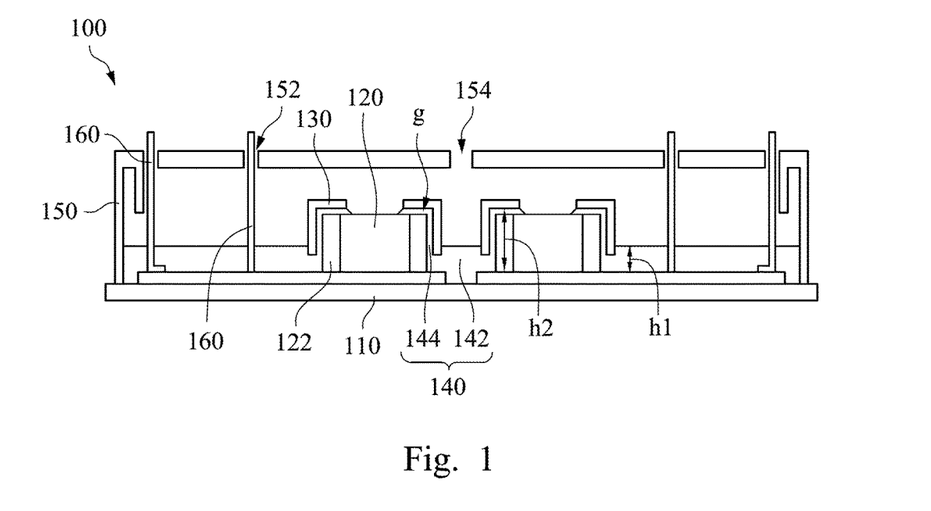
FIG. 1 to FIG. 5 are respectively cross-sectional views of different embodiments of a package module of the present disclosure.

Reference is made to FIG. 1, which is a cross-sectional view of an embodiment of a package module of the present disclosure. The package module 100 includes a circuit board 110, an electronic component 120 disposed on the circuit board 110, a frame 130 disposed next to at least one side of the electronic component 120, and an encapsulant 140. A gap g is formed between the frame 130 and the electronic component 120. The encapsulant 140 includes a first portion 142 covering at least a part of the circuit board 110 and a second portion 144 filling into at least a part of the gap g, wherein the first portion 142 has a first height h1 relative to the circuit board 110, and the second portion 144 has a second height h2 relative to the circuit board 110. The second height h2 is greater than the first height h1. Obviously, the first portion 142 and the second portion 144 of the encapsulant 140 are connected.

More specifically, the thickness (height) of a certain portion of the encapsulant 140, such as the thickness of the second portion 144, is greater than the thickness of another portion of the encapsulant 140, such as the thickness of the first portion 142. This means that the encapsulant 140 is locally thickened by the frame 130 at the proximity of the electronic component 120, thus saving the amount of the encapsulant 140. By the capillary action, it would be more easily to achieve the local thickening of the encapsulant 140 at the proximity of the electronic component 120.

The package module 100 is a package module packaged in a housing, that is, the package module 100 includes a housing 150 assembled on the circuit board 110, while the electronic component 120 and the frame 130 are in the housing 150. The encapsulant 140 may be poured into the housing 150 to cover the circuit board 110 and to fill the gap g.

The electronic component 120 and a pin 160 can be fixed to the circuit board 110 by welding with solder. The encapsulant 140 covering on the circuit board 110 can protect the connections of the pin 160 and the electronic component 120 to the circuit board 110.

The electronic component 120 can include a plurality of bonding regions 122. The bonding regions 122 are regions for electrical connection and are to be sealed by the encapsulant 140, but the present disclosure is not limited thereto. The electronic component 120 can be connected to the circuit board 110 via the bonding regions 122 and by welding with solder, and then the bonding regions 122 are encapsulated by the encapsulant 140. The electronic component 120 can be a capacitor, a resistor, an inductor, a chip, a transformer, a switch, a binding wire or similar devices, but the present disclosure is not limited thereto. The bonding regions 122 of the electronic component 120 can be located at the bottom surface of the electronic component 120, the side surface of the electronic component 120, the top surface of the electronic component 120, or a combination of these, but the present disclosure is not limited thereto. Number of the bonding region 122 for each electronic component 120 can be one or more. In the present embodiment, number of the bonding region 122 in each electronic component 120 can be two, while two bonding regions 122 can be generally located at two opposite sides of the electronic component 120, and the bonding regions 122 can extend from the side surfaces of the electronic component to the bottom surface and the top surface of the electronic component.

In some embodiments, the encapsulant 140 covers the bonding regions 122 on the electronic component 120. The encapsulant 140 provides, in addition to the function of electrical isolation, insulation against moisture, preventing moisture from affecting the bonding regions 122 of the electronic component 120 and thus protecting the electronic component 120, but the present disclosure is not limited thereto.

The housing 150 can include a through hole 152, wherein an end of the pin 160 can be fixed to the circuit board 110 and the other end of the pin 160 can pass through the through hole 152 to be exposed from the housing 150 so as to connect to an exterior circuit, but the present disclosure is not limited thereto.

The housing 150 can include an encapsulant injection port 154, wherein the encapsulant 140 is filled into the housing 150 via the encapsulant injection port 154. The encapsulant 140 can be a gel such as organic silica gel or epoxy resin, etc.

In the present embodiment, the position of the encapsulant injection port 154 is not overlapped with that of the electronic component 120, that is, the vertical projection of the encapsulant injection port 154 onto the circuit board is not overlapped with the electronic component, but the present disclosure is not limited thereto. For example, in another embodiment, the position of the encapsulant injection port 154 can be overlapped with that of the electronic component 120. The encapsulant 140 may have at least two portions. The encapsulant 140 can cover on at least a part of the circuit board 110 to form the first portion 142. The first height h1 of the first portion 142 may be greater than the distance between the bottom end of the frame 130 and the circuit board 110, so that the encapsulant 140 can climb up, by the capillary action, from the bottom of the gap g to fill into the gap g and thus form the second portion 144, but the present disclosure is not limited thereto. As a result, the encapsulant 140 can cover the bonding regions 122 of the electronic component 120 and form the second portion 144 of the encapsulant 140. The second portion 144 has a larger height (e.g. the second height h2) while the first portion 142 has a smaller height (e.g. the first height h1).

Figure 2:
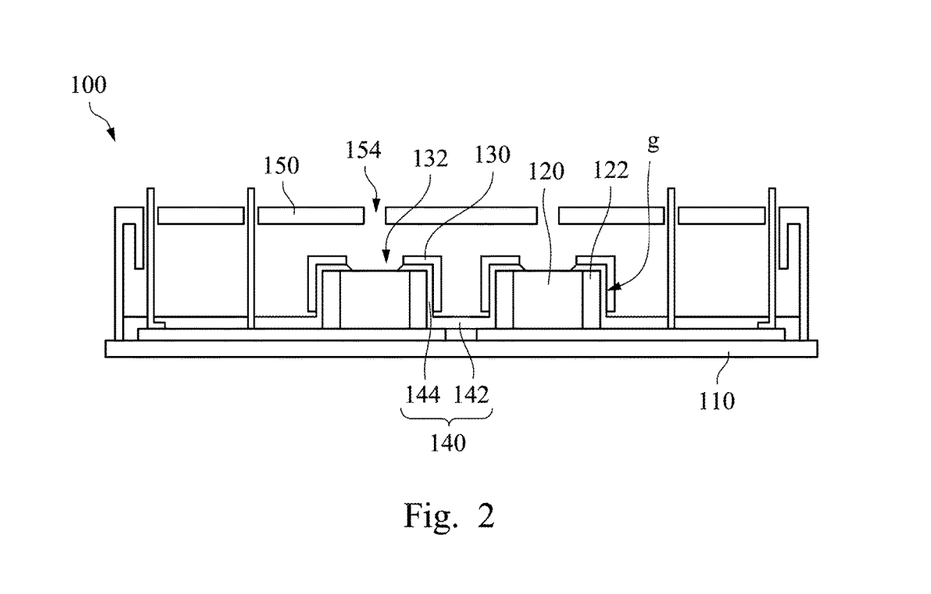

Reference is made to FIG. 2, which is a cross-sectional view of another embodiment of a package module of the present disclosure. In the present embodiment, the position of the encapsulant injection port 154 of the housing 150 is overlapped with that of the electronic component 120, that is, the vertical projection of the encapsulant injection port 154 onto the circuit board 110 is overlapped with the electronic component 120. In this situation, after filled into the housing 150 from the encapsulant injection ports 154, the encapsulant 140 would flow from top ends of the electronic component 120 and the frame 130 downward to cover the circuit board 110. The frame 130 has an opening 132 over the electronic component 120, wherein the encapsulant 140 can flow via the opening 132 into the gap g between the frame 130 and the electronic component 120. The excess portion of the encapsulant 140 outside of the frame 130 would flow downward by the action of the gravity, while the portion of the encapsulant 140 inside of the frame 130 (i.e. the second portion 144 of the encapsulant 140 in the gap g) would be retained in the gap g by the action of surface tension.

As a result, the bottom end of the frame 130 can be higher than the first portion 142 of the encapsulant 140, as shown in FIG. 2. Alternatively, the bottom end of the frame 130 can be embedded in the first portion 142 of the encapsulant 140, as shown in FIG. 1.

The distance of the gap g (i.e. the distance between the frame 130 and the electronic component 120) can be obtained by specific design. In an embodiment, the minimum distance of the gap g is preferably less than or equal to 2 mm; for example, it can be 0.5 mm, 1 mm, 1.5 mm, etc., but the present disclosure is not limited thereto.

Figure 3:
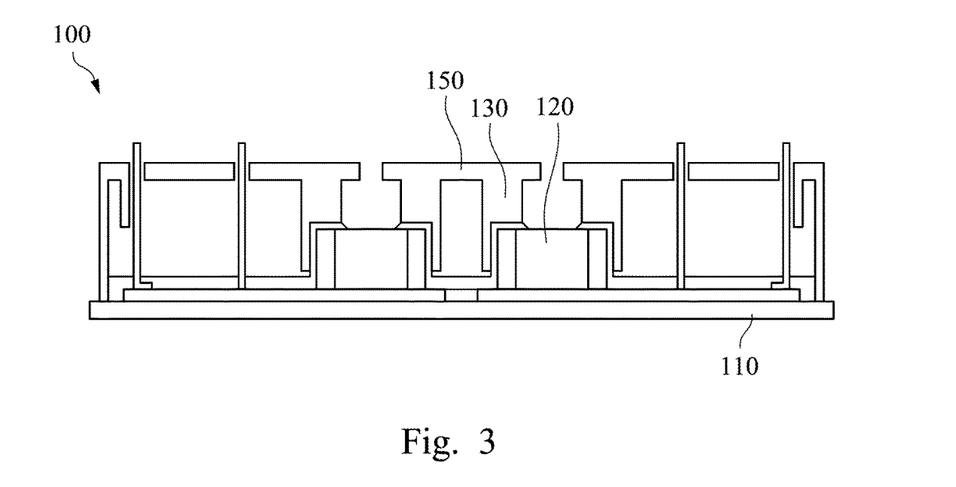

Reference is made to FIG. 3, which is a cross-sectional view of another embodiment of a package module of the present disclosure. In the present embodiment, the frame 130 and the housing 150 are connected. Material for the frame 130 and that for the housing 150 can be both plastics, but the present disclosure is not limited thereto. The frame 130 and the housing 150 can be integrally formed by, for example, injection molding, and the position and the dimensions of the frame 130 can be determined by the distribution and the size of the electronic components 120 on the package module 100, but the present disclosure is not limited thereto.

Figure 4:
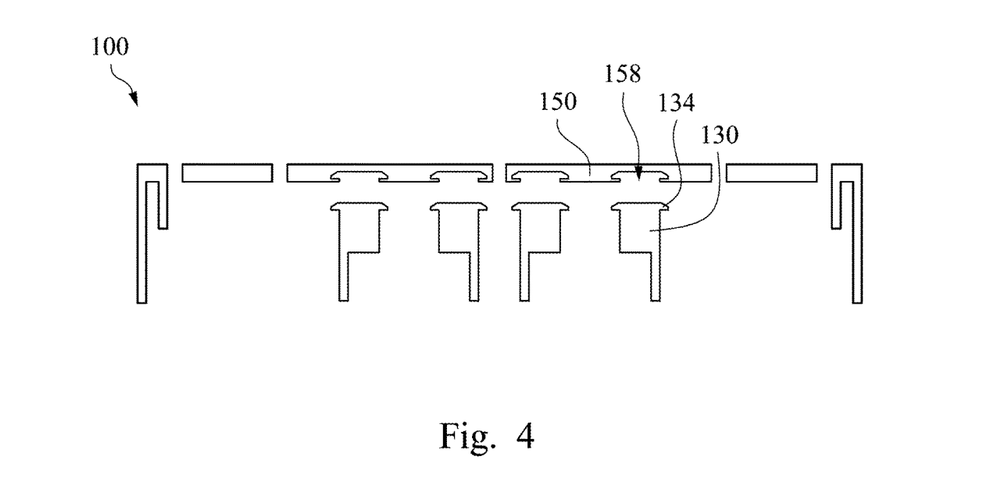

In other embodiments, the frame 130 can also be assembled to the housing 150 by any other appropriate method. As shown in FIG. 4, the frame 130 and the housing 150 can be combined by hooking, clipping, screwing, etc. Specifically, a recess 158 can be formed on the inner wall at the top of the housing 150, and the frame 130 includes a flange 134 corresponding to the recess 158. By inserting the flange 134 into the recess 158, the frame 130 can be combined with the housing 150.

Figure 5:
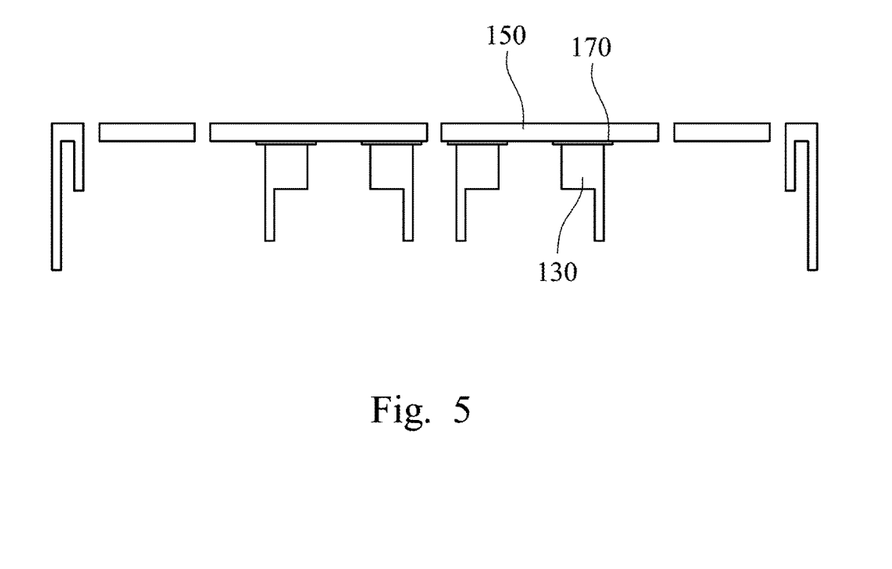

Alternatively, as shown in FIG. 5, the frame 130 and the housing 150 can also be combined by glue 170. In this situation, the housing 150 preferably has a position mark so that the frame 130 can be combined to the housing 150 at the correct position.

Figure 6A:
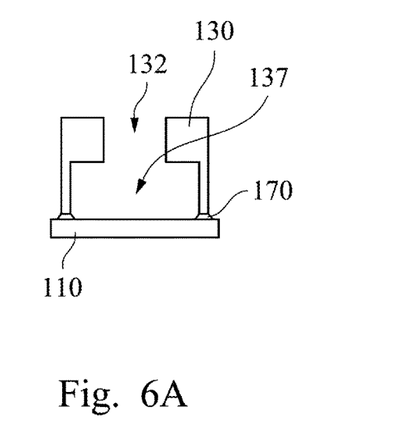
FIG. 6A and FIG. 6B are respectively a front view and a side view of an embodiment of a package module of the present disclosure, in which a frame is fixed to the circuit board.
Figure 6B:
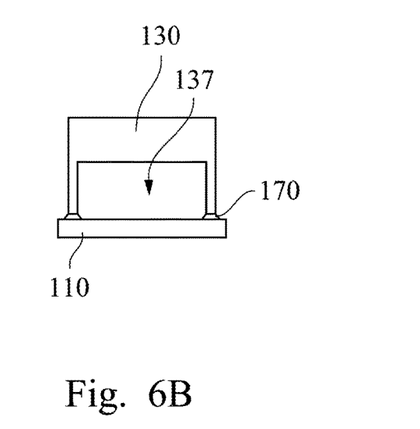

In other embodiments, the frame 130 can also be fixed to, for example, the circuit board 110, as shown in FIG. 6A and FIG. 6B, wherein FIG. 6A is a front view of the frame 130 fixed to the circuit board 110, and FIG. 6B is a side view of the frame 130 fixed to the circuit board 110. The frame 130 may be fixed to the circuit board 110 by the glue 170, but the present disclosure is not limited thereto. The frame 130 may have an opening 132 at the top of the electronic component 120 (see FIG. 1), and the encapsulant may be filled via the opening 132 into the gap between the frame 130 and the electronic component (not shown in the figures). Alternatively, via holes 137 can be formed on the sidewall of the frame 130, so that the encapsulant can flow via the via holes 137 into the gap between the frame 130 and the electronic component.

Accordingly, the frame 130 can be combined to the housing 150, to the circuit board 110, or to both of the housing 150 and the circuit board 110 by several methods such as by integrally formed with the housing 150 and/or the circuit board 110, by connected with glue, by clamping, or by locking with screw, etc. The frame 130 can have a different shape as long as the function described herein can be realized. In other embodiments, the frame 130 is not limited to be connected with the housing 150 or the circuit board 110, as long as the frame 130 can be fixed.

Figure 7:
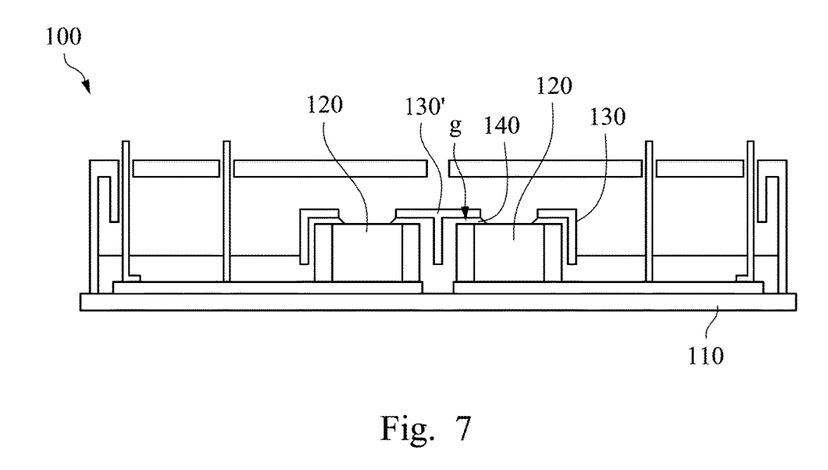
FIG. 7 is a cross-sectional view of another embodiment of a package module of the present disclosure.

Reference is made to FIG. 7, which is a cross-sectional view of another embodiment of a package module of the present disclosure. In some embodiments, there may be a situation where two electronic components 120 disposed on the circuit board 110 are closely adjacent. In such a situation where the space is limited, the two electronic components 120 can share a frame. For example, a T shape frame 130' is disposed between the two electronic components 120. If the distance between the electronic components 120 is further reduced, it is also possible to directly use the gap formed between the electronic components 120. In other words, in an embodiment, frames such as L shape frames 130 can be disposed at only one side (the outer side) of two adjacent electronic components 120, while at the other side (the inner side of two adjacent electronic components 120), a T shape frame 130' is disposed or no frame is disposed.

Figure 8A:
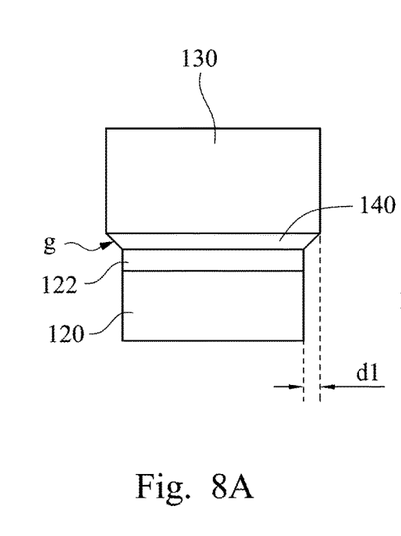
FIG. 8A and FIG. 8B are respectively a partial side view and a partial top view of another embodiment of a package module of the present disclosure.
Figure 8B:
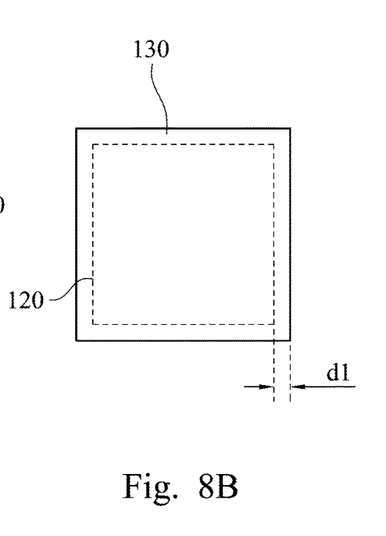

Reference is made to FIG. 8A and FIG. 8B, which are respectively a partial side view and a partial top view of another embodiment of a package module of the present disclosure. In some embodiments, the bonding region 122 of one or more electronic components 120 can be disposed at the top surface (i.e. the surface opposite and parallel to the circuit board) of the electronic component 120. A gap g may be formed between the frame 130 and the top surface of the electronic component 120, and the encapsulant 140 fills the gap g. To cover the bonding region 122 by the encapsulant 140, the outer edge of the frame 130 preferably extends beyond the outer edge of the electronic component 120 by a distance d1. The distance d1 for example can be greater than 0.2 mm, but the present disclosure is not limited thereto.

Figure 9A:
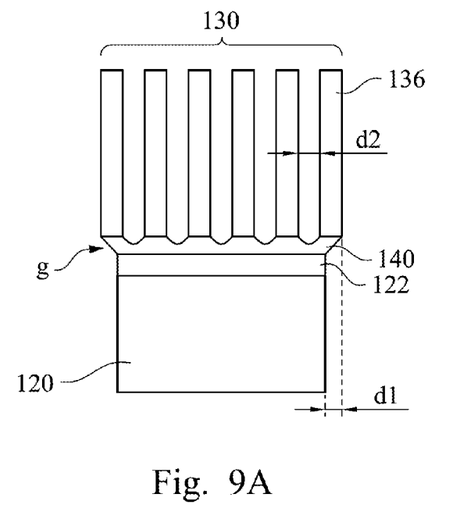
FIG. 9A and FIG. 9B are respectively a partial side view and a partial top view of another embodiment of a package module of the present disclosure.
Figure 9B:
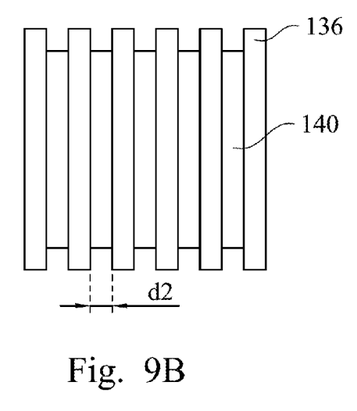

In other embodiments, the frame 130 can have a distributed structure. For example, the frame 130 may include a plurality of sheets 136, as shown in FIG. 9A and FIG. 9B.

A bonding region 122 is disposed on the top surface of the electronic component 120, and the sheets 136 can be paralleled arranged in array on the top surface of the electronic component 120 and can be fixed over the electronic component 120 by, for example, connecting to the housing, but the present disclosure is not limited thereto. The sheets 136 can also be disposed at other surfaces of the electronic component 120. A gap g is also formed between the sheets 136 and the electronic component 120, and the encapsulant 140 is filled in the gap g. The distance d2 between the adjacent sheets 136 may be less than 1.5 mm, to ensure the encapsulant 140 still covers the bonding region 122 at the center point of the two adjacent sheets 136 and thus provides effects of electrical isolation and protection, but the present disclosure is not limited thereto. Similarly, the outer edge of the frame 130 preferably extends beyond the outer edge of the electronic component 120 by a predetermined distance d1, but the present disclosure is not limited thereto.

Figure 10A:
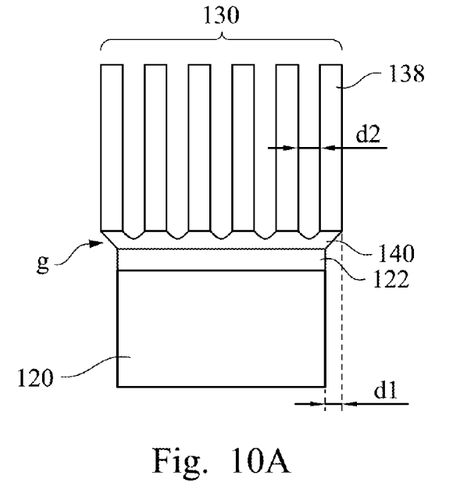
FIG. 10A and FIG. 10B are respectively a partial side view and a partial top view of another embodiment of a package module of the present disclosure.
Figure 10B:
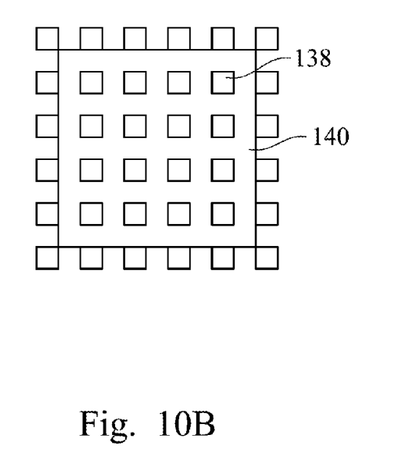

In other embodiments, the frame 130 is not limited to blocks or sheets. As shown in FIG. 10A and FIG. 10B, the frame 130 can includes a plurality of columns 138. To cover the bonding region 122 by the encapsulant 140, the distance d2 between the adjacent columns 138 can be preferably less than or equal to than 1.5 mm, but the present disclosure is not limited thereto. The cross-section of each column 138 can be square, circular or in other shapes. The outer edge of the frame 130 can extend beyond the outer edge of the electronic component 120 by a predetermined distance d1, but the present disclosure is not limited thereto.

Figure 11:
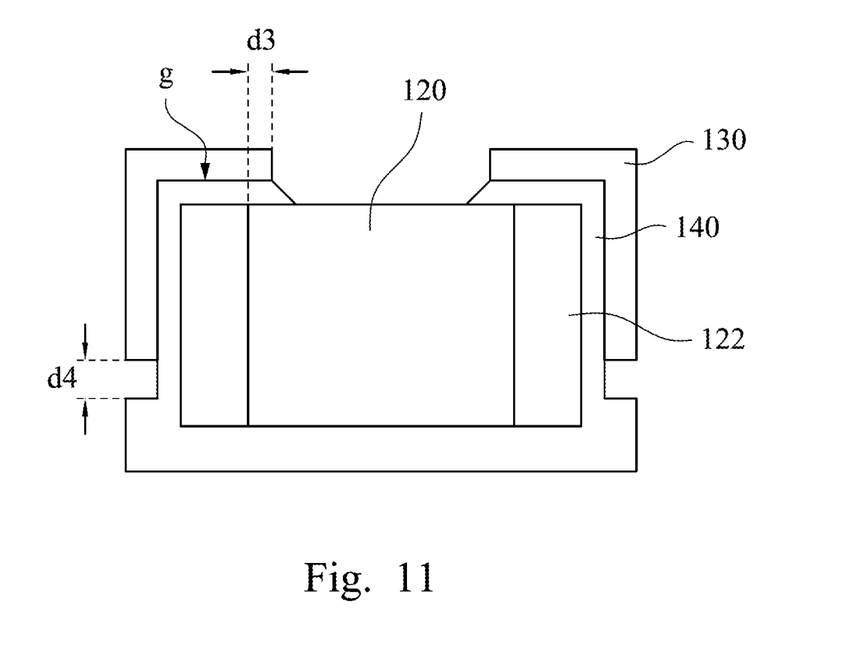
FIG. 11 is a partial cross-sectional view of another embodiment of a package module of the present disclosure.

Reference is made to FIG. 11, which is a partial cross-sectional view of another embodiment of a package module of the present disclosure. The bonding regions 122 of the electronic component 120 are disposed at two sides of the electronic component 120, and parts of the bonding regions 122 are disposed at the top surface and the bottom surface of the electronic component 120. An outer edge of the frame 130 can extend beyond an edge of the bonding region 122 at the top surface of the electronic component 120 by a distance d3. The distance d3 is, for example, at least 0.2 mm, so that the encapsulant 140 filled into the gap g between the frame 130 and the electronic component 120 covers the bonding region 122 at the top surface of the electronic component 120, but the present disclosure is not limited thereto.

The bottom end of the frame 130 can be embedded into the encapsulant 140 or not. If the bottom end of the frame 130 is not embedded into the encapsulant 140, the distance d4 between the bottom end of the frame 130 and the encapsulant 140 may less than or equal to 1 mm, so that the encapsulant 140 can flow into the gap g by the adhesion force between the encapsulant 140 and the sidewall of the electronic component 120, but the present disclosure is not limited thereto.

Figure 12:
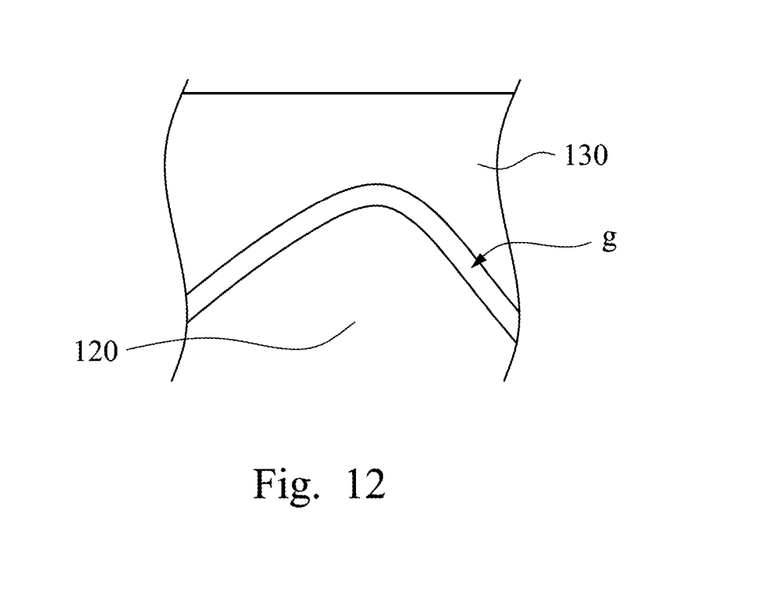
FIG. 12 is a partial enlarged view of another embodiment of a package module of the present disclosure.

Reference is made to FIG. 12, which is a partial enlarged view of another embodiment of a package module of the present disclosure. The shape of the frame 130 may be in accordance to the surface of the electronic component 120, so as to form a gap g between the frame 130 and the electronic component 120. For example, if the surface of the electronic component 120 is in irregular shape as shown in FIG. 12, the corresponding frame 130 can be in a corresponding irregular shape, to ensure the gap g stable between the frame 130 and the electronic component 120.

Figure 13:
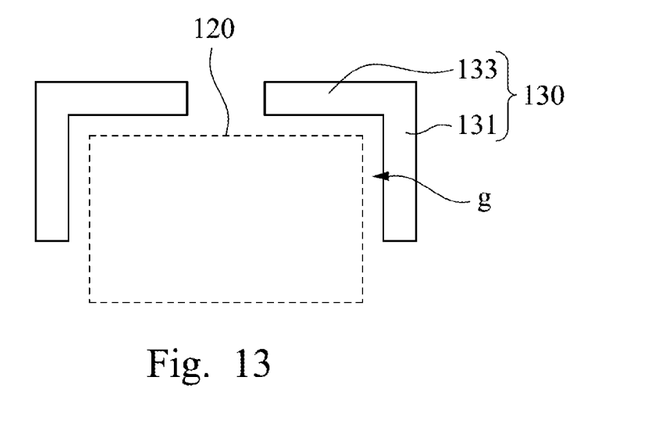
FIG. 13 to FIG. 17 are respectively schematic views of frames in different embodiments of a package module of the present disclosure.

Reference to FIG. 13, the frame 130 can be in a reversed L shape and can be disposed at a side of the electronic component 120. The frame 130 can include a vertical portion 131 and a horizontal portion 133 connected together, wherein an angle between the vertical portion 131 and the horizontal portion 133 is approximately (but not limited to) 90 degree. A part of the gap g may be formed between the vertical portion 131 and electronic component 120, and another part of the gap g may be formed between the horizontal portion 133 and the electronic component 120. The vertical portion 131 and the horizontal portion 133 can be integrally formed and can include an insulation material, but the present disclosure is not limited thereto. For example, the vertical portion 131 and the horizontal portion 133 may also be comprised by the distributed structures, such as that shown in FIG. 9A to FIG. 10B.

Both the vertical portion 131 and the horizontal portion 133 can be flat plates. As shown in FIG. 13, the facing sides to the electronic component 120 of the vertical portion 131 and the horizontal portion 133 are both flat.

Figure 14:
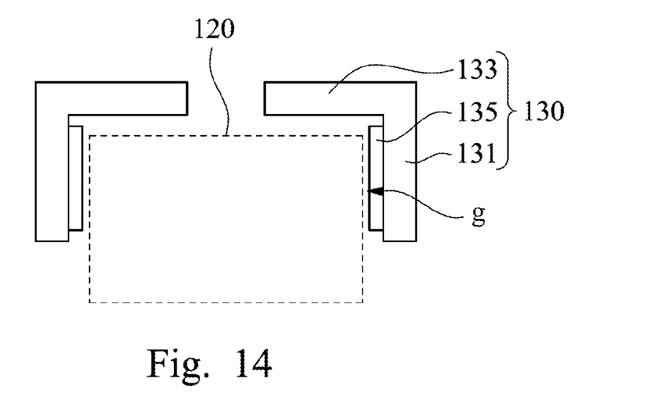
Figure 15:
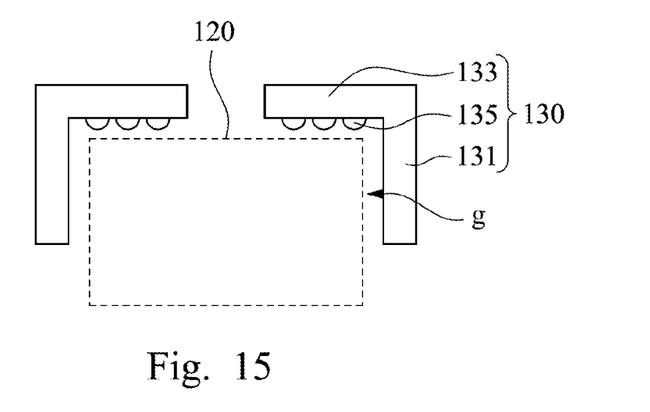

Alternatively, in other embodiments, as shown in FIG. 14, the frame 130 further includes a protrusion 135 connected to the inner surface of the vertical portion 131. The protrusion 135 can be integrally formed with the vertical portion 131, and at least a part of the gap g is also formed between the protrusion 135 and the electronic component 120. The protrusion 135 can be a rib, a column, a bump, a projection, or in other shapes. In this situation, the minimum distance of the gap g may be achieved between the protrusion 135 and the electronic component 120. The minimum distance is less than or equal to 1 mm, but the present disclosure is not limited thereto. In other embodiments, the protrusion 135 can also be disposed on the horizontal portion 133 of the frame 130, as shown in FIG. 15.

Figure 16:
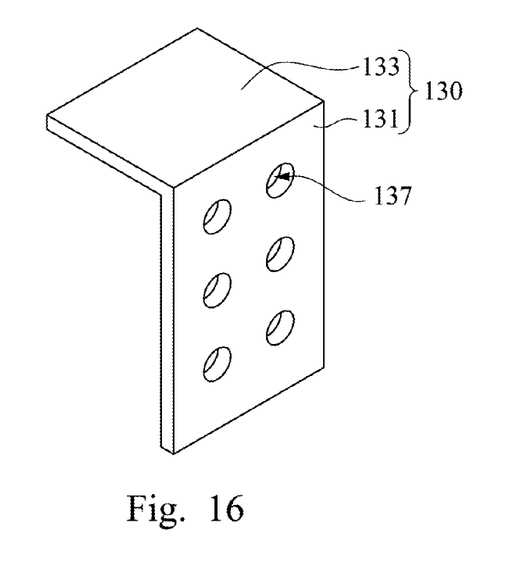
Figure 17:
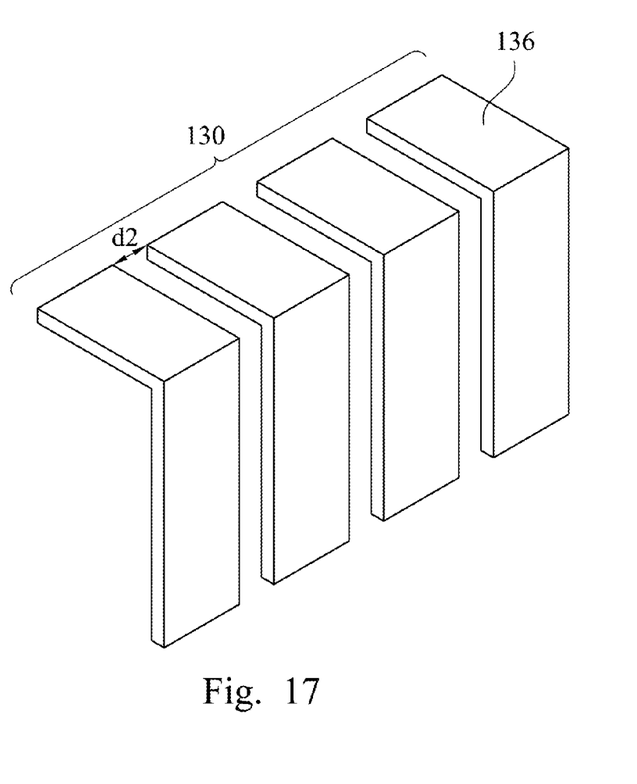

Alternatively, via holes 137 can be disposed at the vertical portion 131 of the frame 130, as shown in FIG. 16, to save the material of the frame 130 and facilitate the encapsulation of the bonding region 122. Size of via holes 137 and the ratio of via holes 137 to the vertical portion 131 can be controlled in certain range to ensure that the bonding region 122 on the electronic component 120 would not be exposed from the encapsulant. In other embodiments, the frame 130 may include a plurality of L shape sheets 136, as shown in FIG. 17. Each sheet 136 includes connected or adjacent vertical portions 131 and horizontal portions 133. The distance d2 between the adjacent two sheets 136 is less than or equal to 1.5 mm, but the present disclosure is not limited thereto.

Accordingly, the embodiments of the present disclosure provides a package module packaged in a housing, in which the frame is disposed next to the at least one side of the electronic component, and the encapsulant is filled into the gap between the frame and the electronic component. As a result, the height of the encapsulant covering the electronic component is higher than that of another portion of the encapsulant (e.g. the encapsulant covering the circuit board), and therefore the amount of the encapsulant is saved.

Although the present disclosure has been described in considerable details with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims and their equivalents.

What is claimed is:

1. A package module, comprising:
    a circuit board;
    an electronic component disposed on the circuit board;
    a frame disposed next to at least one side of the electronic component, wherein a gap is formed between the frame and the electronic component; and
    an encapsulant comprising a first portion covering at least a part of the circuit board and a second portion filling into at least a part of the gap, the first portion being connected to the second portion, the first portion and the second portion being located on two opposite sides of the frame respectively, the first portion being in contact with the frame, the second portion being in contact with the frame and the electronic component, the first portion having a first height relative to the circuit board, the second portion having a second height relative to the circuit board, wherein the first height and the second height are from highest positions of the first portion and the second portion to the circuit board respectively, a distance between a bottom end of the frame and the circuit board is less than the first height and the second height is greater than the first height;
    a housing, wherein the electronic component, the frame, and the encapsulant are in the housing; and
    wherein the housing comprises an encapsulant injection port, wherein a vertical projection of the encapsulant injection port onto the circuit board is not overlapped with the electronic.

2. The package module of claim 1, wherein the housing comprises an encapsulant injection port, wherein a vertical projection of the encapsulant injection port onto the circuit board is overlapped with the electronic component.

3. The package module of claim 1, wherein the frame is connected to the housing or to the circuit board.

4. The package module of claim 3, wherein the frame has a flange, and the flange is connected to a recess of the housing or the circuit board.

5. The package module of claim 1, wherein the frame comprises a vertical portion, wherein at least a part of the gap is formed between the vertical portion and the electronic component.

6. The package module of claim 5, further comprising at least one protrusion connected to the vertical portion, wherein at least a part of the gap is formed between the protrusion and the electronic component.

7. The package module of claim 6, wherein the protrusion is a rib, a column, a bump, a projection, or combinations thereof.

8. The package module of claim 5, wherein the vertical portion comprises at least one via hole.

9. The package module of claim 1, wherein the frame comprises a horizontal portion, wherein at least a part of the gap is formed between the horizontal portion and the electronic component.

10. The package module of claim 9, further comprising at least one protrusion connected to the horizontal portion, wherein at least a part of the gap is formed between the protrusion and the electronic component.

11. The package module of claim 1, wherein the frame has a shape which is in accordance to a surface of the electronic component so as to form the gap.

12. The package module of claim 1, wherein the electronic component comprises a capacitor, a resistor, an inductor, a chip, a transformer, a switch, or a binding wire, and the encapsulant comprises organic silicone gel or epoxy resin.

13. The package module of claim 1, wherein a minimum distance of the gap is less than or equal to 2 mm.

14. A packaging method for the package module of claim 1, comprising:
- disposing the electronic component on the circuit board;
- disposing the frame next to the at least one side of the electronic component so as to form the gap between the frame and the electronic component; and
- pouring the encapsulant after forming the gap, wherein a portion of the encapsulant covers on at least a part of the circuit board so as to be the first portion, and another portion of the encapsulant fills into at least a part of the gap so as to be the second portion, wherein the first portion is connected to the second portion, the first portion and the second portion are located on two opposite sides of the frame respectively, the first portion is in contact with the frame, the second portion is in contact with the frame and the electronic component, the first portion has a first height relative to the circuit board, and the second portion has a second height relative to the circuit board, wherein the first height and the second height are from highest positions of the first portion and the second portion to the circuit board respectively, a distance between a bottom end of the frame and the circuit board is less than the first height, and the second height is greater than the first height.

15. The packaging method of claim 14, wherein the encapsulant is poured onto the circuit board and then flows into the gap from a bottom of the gap.

16. The packaging method of claim 14, wherein the encapsulant is poured onto the electronic component and then flows through the gap to cover on the circuit board.

\* \* \* \* \*